United States Patent [19]
Crumly

[11] Patent Number: 5,762,845
[45] Date of Patent: Jun. 9, 1998

[54] METHOD OF MAKING CIRCUIT WITH CONDUCTIVE AND NON-CONDUCTIVE RAISED FEATURES

[75] Inventor: William R. Crumly, Anaheim, Calif.

[73] Assignee: Packard Hughes Interconnect Company, Irvine, Calif.

[21] Appl. No.: 752,082

[22] Filed: Nov. 19, 1996

[51] Int. Cl.⁶ ............................................. C04B 35/00
[52] U.S. Cl. ........................ 264/104; 264/219; 264/261
[58] Field of Search .................................. 264/104, 219, 264/261; 156/99, 277, 292; 205/78

[56] References Cited

U.S. PATENT DOCUMENTS

| | | | |
|---|---|---|---|
| 3,013,913 | 12/1961 | Croop et al. | 264/104 |
| 3,522,339 | 7/1970 | Velde | 264/104 |
| 4,402,135 | 9/1983 | Schweingruber et al. | 264/104 |
| 4,758,459 | 7/1988 | Mehta | 264/104 |
| 4,783,719 | 11/1988 | Jamison et al. | 361/398 |
| 4,898,759 | 2/1990 | Hoover et al. | 264/104 |
| 5,055,778 | 10/1991 | Okubo et al. | 324/158 P |
| 5,090,118 | 2/1992 | Kwon et al. | 29/843 |
| 5,108,977 | 4/1992 | Huff | 324/158 P |
| 5,134,365 | 7/1992 | Okubo et al. | 324/158 P |
| 5,166,602 | 11/1992 | Byford et al. | 324/158 P |
| 5,207,887 | 5/1993 | Crumly et al. | 205/78 |
| 5,283,446 | 2/1994 | Tanisawa | 257/433 |
| 5,304,922 | 4/1994 | Betz et al. | 324/158 P |

*Primary Examiner*—Christopher A. Fiorilla
*Attorney, Agent, or Firm*—Anthony Luke Simon

[57] ABSTRACT

A method of making a circuit with raised features includes the steps of: forming a mandrel having a plurality of depressions therein; coating said mandrel and depressions with a coating that is readily separable from the mandrel and said depressions; forming a pattern of circuit traces on said coating and in a first subset of said depressions; forming a substrate on said traces; adding a material to said coating at least in a second set of said depressions not containing circuit traces; removing said traces, said substrate, said material and said coating from said mandrel wherein a plurality of raised features project from a plane of said circuit traces; and removing the coating from said traces, said raised features, said material and said substrate, wherein a first subset of said raised features comprises conductive raised features and wherein a second subset of said raised features comprises nonconductive raised features.

12 Claims, 3 Drawing Sheets

1

METHOD OF MAKING CIRCUIT WITH CONDUCTIVE AND NON-CONDUCTIVE RAISED FEATURES

This invention relates to a circuit with conductive and nonconductive raised features and method of manufacture thereof.

BACKGROUND OF THE INVENTION

U.S. Pat. No. 5,207,887 describes a method, using formed mandrels, of making semi-additive circuitry with raised features. The raised features are metal that may be part of the circuit traces of the circuit and are suitable for making electrical contact to contact pads on an integrated circuit or other circuit component.

SUMMARY OF THE INVENTION

It is an object of this invention to provide a circuit with conductive and non-conductive raised features according to claim 1.

Advantageously, this invention provides a circuit, formed using a mandrel, with conductive raised features, such as taught in the Pat. No. 5,207,887 and also with non-conductive raised features.

Advantageously, according to an example of this invention, a circuit with conductive and non-conductive raised features is provided so that when the circuit is placed in pressure contact with an integrated circuit or other fragile circuit component, the conductive raised features make electrical contact with the integrated circuit or other component. At the same time, the non-conductive raised features spread the load of the pressure force among a plurality of points on the integrated circuit or other circuit component, preventing the raised metal features from damaging the integrated circuit or other electrical component. This allows assembly processes requiring more pressure between the circuit with raised features and the integrated circuit or other electrical device.

Advantageously, according to another example of this invention, the non-conductive raised features comprise a tacky substance such as a tacky elastomer allowing the circuit to temporarily attach to an integrated circuit chip or other electrical component during assembly of the final circuit product. This feature facilitates flexibility in manufacture and design in that it allows alignment and temporary attachment to take place separate from other assembly operations.

Advantageously then, according to a preferred example of this invention, a method of making a circuit with raised features is provided comprising the steps of: forming a mandrel having a plurality of depressions therein; coating said mandrel and depressions with a coating that is readily separable from the mandrel and said depressions; forming a pattern of circuit traces on said coating and in a first subset of said depressions; forming a substrate on said traces; adding a material to said coating at least in a second set of said depressions not containing circuit traces; removing said traces, said substrate, said material and said coating from said mandrel wherein a plurality of raised features project from a plane of said circuit traces; and removing the coating from said traces, said raised features, said material and said substrate, wherein a first subset of said raised features comprises conductive raised features and wherein a second subset of said raised features comprises nonconductive raised features.

BRIEF DESCRIPTION OF THE DRAWINGS

The present invention will now be described by way of example with reference to the following drawings, in which.

DETAILED DESCRIPTION OF THE INVENTION

An example of the preferred method of fabricating a circuit with conductive and non-conductive raised features according to this invention is now provided. Because portions of the method are similar to the example method set forth in U.S. Pat. No. 5,207,887, portions of that patent are reproduced in the description below.

Figure 1:
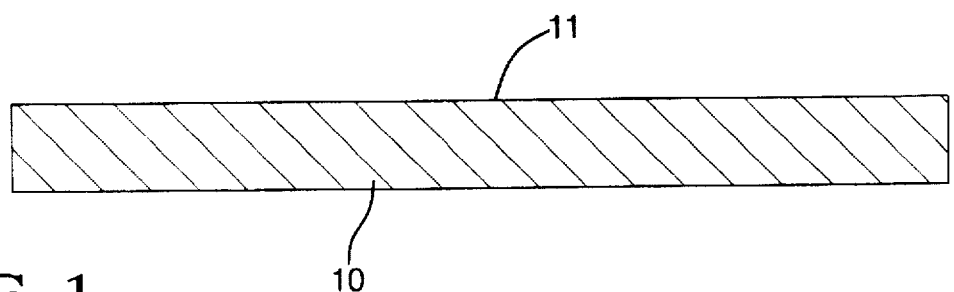
FIGS. 1–9 illustrate steps in an example manufacture of a circuit with conductive and non-conductive raised features.
Figure 2:
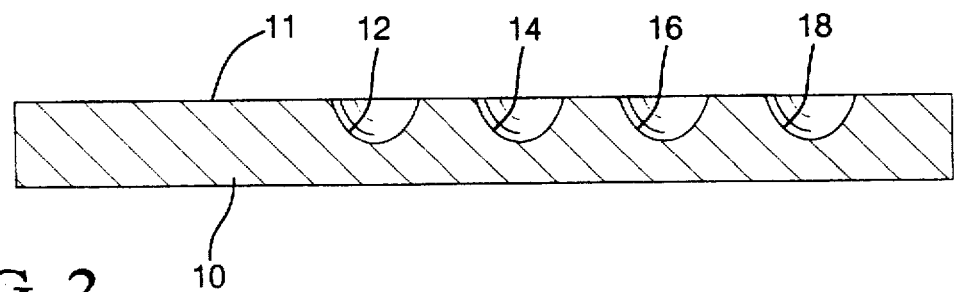

As illustrated in FIG. 1, a mandrel 10, for example formed of a stainless steel plate, includes a forming surface 11 in which is provided a plurality of depressions or dimples 12–18 as shown in FIG. 2, which will define conductive and non-conductive raised features of a resulting circuit assembly.

Figure 3:
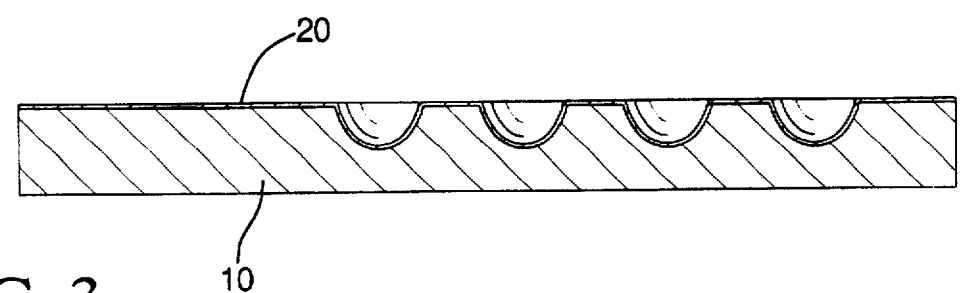

As shown in FIG. 3, the mandrel and its depressions are then coated with a copper coating 20, typically referred to as flash plated, which covers the entire surface of the mandrel including the surface of the depressions. The flash plated copper is applied by electroplating or other known techniques and provides a thin conductive coating that prevents the adhesive or other material that will be used to laminate the circuit substrate from adhering to the mandrel surface. Flash plating is a conventional electrolytic plating formed in a very short or momentary operation so that only a very thin plating coat is provided. The flash plated coat is very thin compared to the thickness of electrical circuit traces that are made. For example, for a circuit trace of .0015 inches thick, a flash plating of copper on the mandrel will have a thickness of .00001 to .0002 inches thick. The thin flash plating is employed because it can be relatively easily released from the stainless steel mandrel and, in addition, may be readily removed from the lamination after separation from the mandrel by a flash etching which is a very short time or momentary etching process.

Obviously, other methods for coating the mandrel with a very thin coat of conductive material that is readily separable from the mandrel and which can be readily removed from the completed circuit traces may be employed in the place of electrolytic flash plating. Such methods may include sputtering, vapor deposition and electroless plating. If deemed necessary or desirable, the mandrel may be made of non-electrically conductive material because the thin electrically conductive coating itself enables the additive electro plating of the circuit traces and conductive raised features.

The coating of a dielectric mandrel can be applied by electroless plating, sputtering or any other known method for depositing a conductive material onto a non-conductive surface. After the flash plated copper is applied to the mandrel as layer 20, shown in FIG. 3, the flash plated copper is coated with a photoresist which is then optically exposed through a mask defining a pattern of the desired circuit. The photoresist that has not been polymerized by the exposure is then removed to leave the partially completed assembly in the configuration illustrated in FIG. 4.

As shown, the flash plated copper coating 20 now bears a pattern 22 of photoresist that is a negative pattern of the circuit trace pattern to be fabricated with this mandrel. The photoresist 22 occupies a subset of the plurality of dimples, i.e., dimples 14 and 16, while another subset of the plurality of dimples, i.e., dimples 12 and 18, include no photoresist. In the dimples 12 and 18 where no photoresist is provided, conductive raised features will be formed, for example as part of the circuit traces. In the dimples 14 and 16 containing the photoresist, non-conductive raised features will be formed for purposes of load spreading, or if constructed of tacky substance, as a temporary means for attaching the circuitry to another circuit component or integrated circuit.

Figure 4:
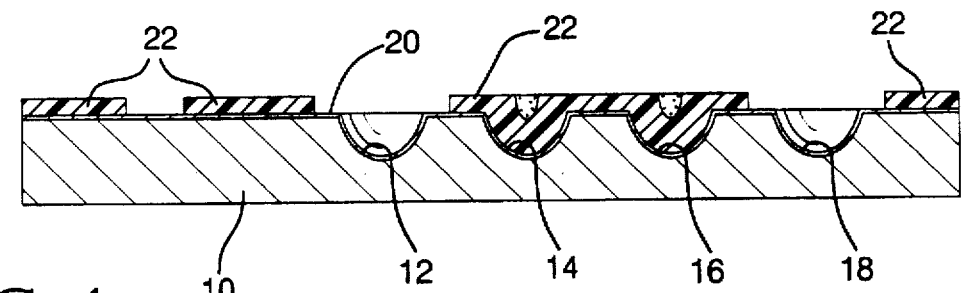
Figure 5:
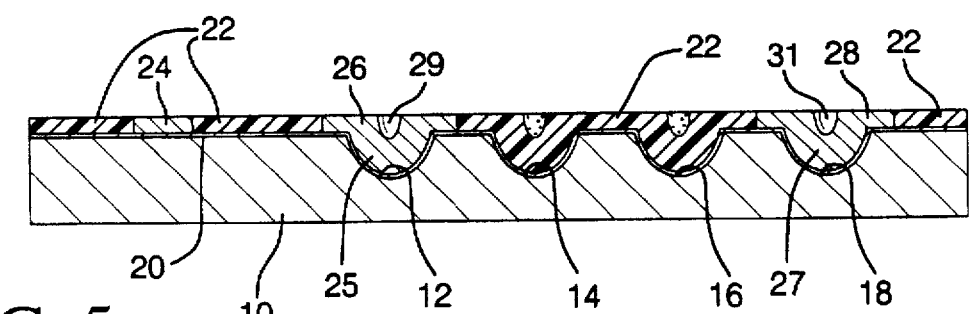

The mandrel assembly of FIG. 4 is then subjected to a suitable additive electro-forming process such as, for example, electroplating to plate up copper traces, i.e., traces 24, 26 and 28, including raised features 25 and 27 in the depressions 12 and 18, as shown in FIG. 5. The copper traces are plated directly onto those portions of the flash plated copper coating 20 that are not covered by the negative pattern of the developed photoresist 22. Thus, the plating process simultaneously forms both the circuit traces and the conductive raised features.

The raised features 25 and 27 may be partly hollow having depressions 29, 31 as shown in FIG. 5. If deemed necessary or desirable, the depressions 29, 31 formed in the electroplated raised features 25, 27, may be filled with a solid material 30, 32 (FIG. 6) by placing a dollop of epoxy in the depression and then allowing the epoxy to cure.

Figure 6:
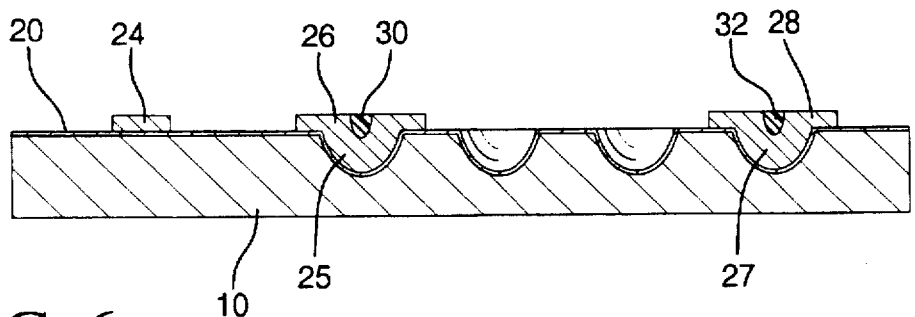

The photoresist 22 is then stripped to leave the circuit traces and raised features 24, 26, 28, 25, 27 on the flash plated copper coating 20, which is still on the mandrel as shown in FIG. 6. Next, a layer of suitable dielectric and adhesive such as, for example a layer 34 of Kapton™ (commercially available from Dupont) and adhesive comprising dielectric 36 and adhesive layer 38, are laminated to the mandrel assembly with the traces and circuit features thereon under suitable high temperatures and pressures. This causes the adhesive to flow into the spaces between the traces and thereby contact traces and pads on three sides and further causes the adhesive to flow into dimples 14 and 16 to form raised features 40 and 42. Only the side of the traces and pads that are in direct contact with the flash plated copper 20 on the mandrel 10 are not contacted by the adhesive/Kapton™ (commercially available from Dupont) substrate 34.

Figure 7:
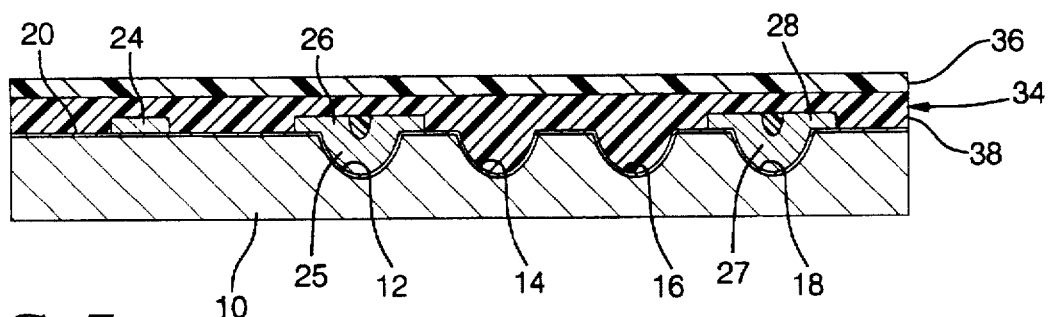

The assembly now appears as in FIG. 7, including the mandrel 10, the flash plated copper 20, the traces and conductive features 24, 26, 28, 25 and 27, the Kapton™ (available from Dupont)/adhesive substrate 36 and non-conductive raised features 40 and 42.

The circuit assembly of FIG. 7 is then removed from the mandrel. Because only the flash plated copper contacts the mandrel, this may be readily separated, no adhesives of substrate 26 is in contact with the mandrel. Thus, it will be seen that because the mandrel has been initially coated with the protective layer of the flash plated copper 20, the assembly of dielectric adhesive substrate and circuit traces and conductive and nonconductive raised features can be readily separated from the mandrel together with the flash plated copper coating. The separated assembly is shown removed from the mandrel in FIG. 8.

Figure 8:
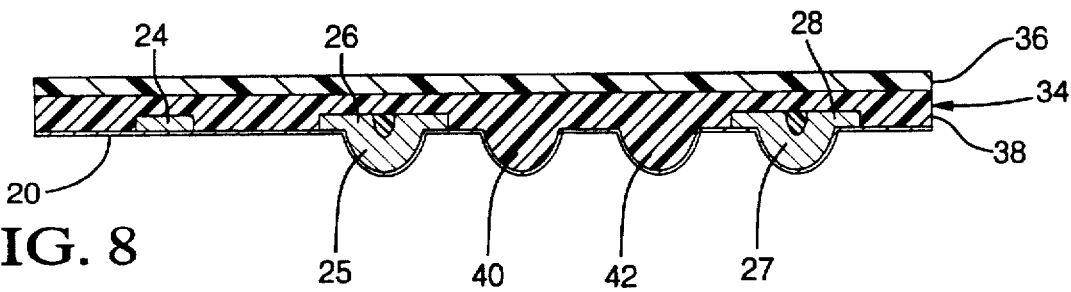
Figure 9:
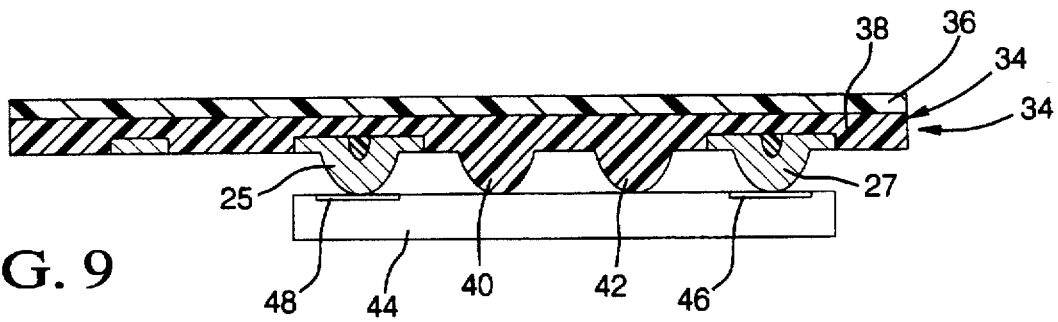

As indicated in FIG. 9, the flash plated copper coating which covers the entire lower (as viewed in FIG. 8) surface of the assembly of FIG. 8 is removed by a flash etching process to yield the finished or substantially finished subassembly of FIG. 9. The subassembly of FIG. 9 is readily for coverlay lamination or other standard process for covering at least the side of the subassembly bearing the conductive traces with an insulative coating or cover lay. The portion of the circuit assembly shown in FIG. 9, including the conductive raised features 25 and 27, are used to contact another electrical component such as integrated circuit chip 44, which has contact pads 48 and 46 for making electrical contact with the electrically conductive raised features 25 and 27 thereon. The non-conductive raised features 40 and 42 serve to spread the load of pressure when the subassembly 39 is pressed against the integrated circuit chip 44. This reduces the risk of breakage at the integrated circuit chip 44, which, in some instances, may be quite fragile. For example, if each conductive feature 25, 27 is surrounded by 50 non-conductive features 40, 42, the point load of each conductive feature 25, 27 on the integrated circuit chip 44 or other electrical component is reduced by over 98% compared to a prior art circuit having no nonconductive raised features. Additionally, in this example, where the adhesive 38 forms the non-conductive features 40, 42, the features 40 and 42 will be tacky. Once the circuit 39 is placed in alignment with the integrated circuit chip 44, it may be pressed against the chip 44 and the tacky features 40 and 42 are used to maintain the integrated circuit chip 44 attached to the circuit assembly 39 until the integrated circuit chip 44 is more permanently attached in a known manner for completing the circuit assembly.

If deemed necessary or desirable, the removal of the flash plated copper coating may be controlled by a stop layer of gold, which will protect the thicker copper circuit during flash etch removal of the flash plate copper. To this end, the flash coated mandrel with its graphically defined resist pattern 22 in place, as shown in FIG. 4, may be plated with a thin layer of gold about 0.00006 inches thick, upon which the circuitry 24, 26, 28 will be plated. This patterned gold stop layer allows the flash plated copper to be removed by the flash etching from the dielectric but protects the copper circuit.

Figure 10:
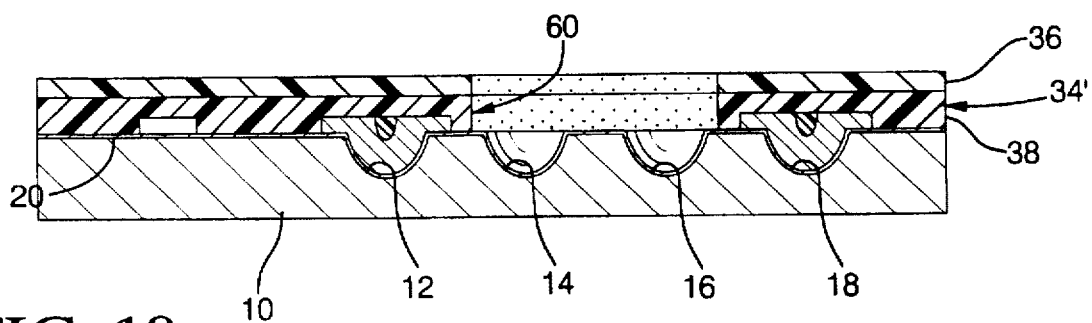
FIGS. 10–12 illustrate steps in a second example manufacture of a circuit with conductive and non-conductive raised features.

Referring now to FIG. 10, another example method for manufacturing the circuit with conductive and non-conductive raised features is shown. After completion of the steps illustrated in FIGS. 1–6, the substrate 34' is provided with one or more openings or windows 60 removed therefrom at positions corresponding to the dimples 14, 16 where it is not desired that raised features be made comprising adhesive 38 or substrate material 36 comprising substrate 34'. The window 60 may be removed by a punch or cutting operation before application of the substrate 34' to the circuitry on the mandrel 10. The substrate 34' is laminated to the remainder of the circuitry on the mandrel 10, as described above.

Figure 11:
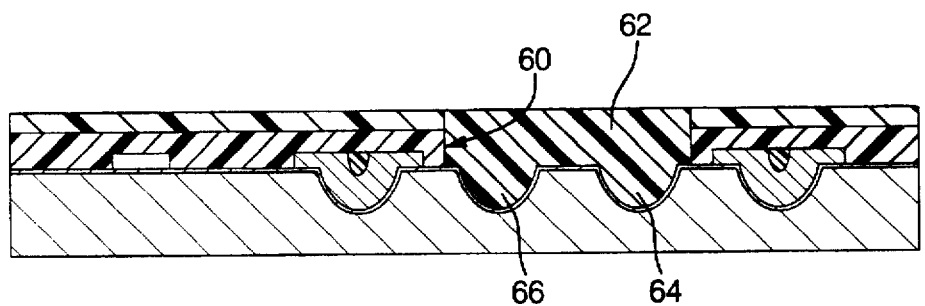

As shown in FIG. 11, the desired material 62 for forming raised features 66 and 64 using dimples 14 and 16 is provided in the window. For example, a curable resin system, such as Sylgard™, commercially available from Dow Corning, may be placed in the window in fluid form and then cured. Alternatively, a material that flows under heat and pressure can be placed in the window 60 and then made to flow into the dimples 14 and 16 by application of the appropriate heat and pressure. Such material may be a plastic of desirable characteristics for the raised features or may be an extra tacky material to provide extra tacky, non-conductive raised features 64 and 66.

Additionally, if desired, a continuous substrate layer may be applied over substrate 34' and material 62 in the form of a layer of Kapton™ (commercially available from Dupont) bonded by an acrylic adhesive.

Figure 12:
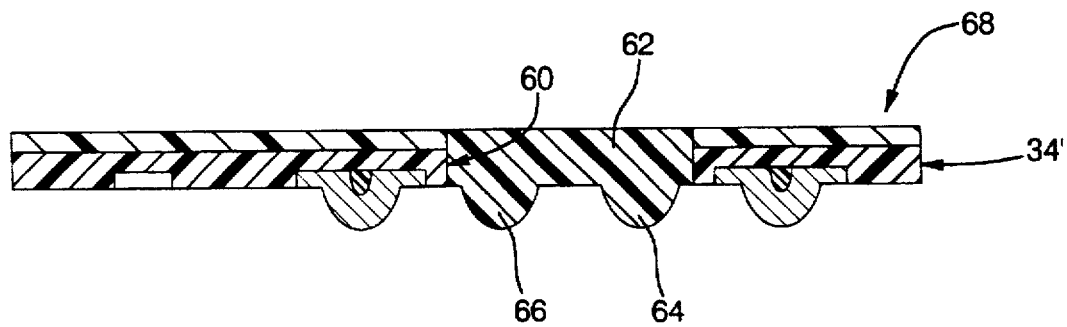

The resultant circuit 68 is shown in FIG. 12 with the raised features 64 and 66 comprising the material 62 formed in the window 60 of the substrate 34'.

In an alternative example, instead of placing the material 62 only in the window(s) 60, the material 62 may comprise part of a substrate layer (not shown) placed over substrate 34', in which case, when heat and pressure are provided, the material 62 flows into window 60 and the dimples 14 and 16 to form the raised features 64, 66.

The provision of the tacky non-conductive features 64 and 66 or 40 and 42 is of great advantage for manufacturers because it allows the alignment of the circuit subassembly 39 or 68 to the integrated circuit chip, i.e., 44 (FIG. 9), separately from alignment of the circuit subassembly to other components and allows remote assembly of the integrated circuit chip 44 or other electronic component(s) to the subassembly 39, 68. When the nonconductive raised features are constructed of a non-tacky plastic allowing them to spread load among the chip, this simplifies design of loading mechanisms for membrane probes and burn-in sockets, for example, of the type related to U.S. Pat. No. 4,783,719, allowing more inexpensive loading mechanisms while not posing risk of damage to the integrated circuit chip. Further, using the non-conductive raised features to spread the load on the chip or component can allow utilization of processes requiring higher pressure forces between the subassembly 39, 68 and the integrated circuit chip 44 than are currently available.

In an example implementation, accuracy of the raised features 40, 42, 66, 64 have been achieved within 5 microns.

According to another example, the shape of some of the depressions in the mandrel are varied to vary the shape of the tacky nonconductive raised features. For example, the tacky non-conductive raised feature(s) may be provided in the form of a square or rectangle one or more millimeters long and wide if a large tacky surface area is desired. The conductive raised features are located next to or around the non-conductive raised feature(s) as desired by the system designer. It may be beneficial to form the tacky non-conductive raised feature taller than the conductive raised features so that during attachment, the tack material forming the nonconductive raised features will flow and underfill the circuit chip. The tacky non-conductive raised features can be used for either temporary adhesion or permanent adhesion.

While the use of tacky elastomer to temporarily hold chips in place is well known in the industry, the incorporation of a tacky elastomer non-conductive bump into a circuit for ease of assembly to a chip is not heretofore known.

In another example for using the non-conductive raised features to permanent attach of an integrated circuit to the circuit subassembly 68, a thermoplastic adhesive of a known type is used as the material 62. When the integrated circuit is brought into contact with the circuit subassembly 68, heat is provided to allow the thermoplastic forming the non-conductive raised features 64, 66 to bond to the integrated circuit to achieve the permanent attachment.

According to another example, the material for the non-conductive raised features comprises a light-transmissive material. The nonconductive raised features, when attached to the integrated circuit chip 44 (FIG. 9), are placed over optically sensitive circuit elements on the chip 44 (or over optical conductors that lead to optically sensitive circuit elements), to source light to the integrated circuit chip. The light sourced through the nonconductive raised features originates from another location on the chip or from another source, such as a fiber-optic cable coupled to the lighttransmissive material forming the non-conductive raised features, i.e., to the side of the material 62 in the window 60 (FIG. 12) opposite the raised features 64, 66.

In all of the above examples, the size, shape, height and density of the raised features will vary from implementation to implementation as required by the system designer.

I claim:

1. A method of making a circuit with raised features comprising the steps of:

forming a mandrel having a plurality of depressions therein;

coating said mandrel and depressions with a coating that is readily separable from the mandrel and said depressions;

forming a pattern of circuit traces on said coating and in a first subset of said depressions;

forming a substrate on said traces;

adding a material onto said coating at least in a second set of said depressions not containing circuit traces;

removing said traces, said substrate, said material and said coating from said mandrel wherein a plurality of raised features project from a plane of said circuit traces; and removing the coating from said traces, said raised features, said material and said substrate, wherein a first subset of said raised features comprises conductive raised features and wherein a second subset of said raised features comprises non-conductive raised features.

2. A method of making a circuit with raised features according to claim 1, wherein said second subset of said raised features comprises a tacky material.

3. A method of making a circuit with raised features according to claim 2, also comprising the step of:

pressing the substrate and traces against an additional structure, wherein said tacky material of the second subset of said raised features attaches to the additional structure, holding the additional structure in place.

4. A method of making a circuit with raised features according to claim 3, wherein said additional structure is permanently held in place by said tacky material of the second subset of said raised features.

5. A method of making a circuit with raised features according to claim 3, wherein said additional structure comprises an integrated circuit chip.

6. A method of making a circuit with raised features according to claim 1, wherein said second subset of raised features comprises a light-transmissive material.

7. A method of making a circuit with raised features according to claim 1, wherein said second subset of raised features comprises a thermoplastic adhesive.

8. A method of making a circuit with raised features according to claim 1, wherein said step of adding the material to said coating at least in the second set of depressions is achieved by laminating the substrate on the traces, wherein material from the substrate flows into the second set of depressions during the lamination.

9. A method of making a circuit with raised features according to claim 1, wherein said coating is electrically conductive.

10. A method of making a circuit with raised features according to claim 1, wherein said mandrel is electrically conductive.

11. A method of making a circuit with raised features according to claim 1, wherein said mandrel is not electrically conductive.

12. A method of making a circuit with raised features according to claim 11 also comprising the step of:

pressing the substrate against an additional structure, wherein said second subset of said raised features spread a load resulting from said pressing to a plurality of points on a surface of the additional structure, whereby the pressing may be achieved using increased force while reducing a risk that the additional structure will be damaged.

* * * * *